(12) United States Patent  (10) Patent No.: US 8,027,140 B2
Owen et al.  (45) Date of Patent: Sep. 27, 2011

(54) REED SWITCH ARRAYS

(75) Inventors: David Paul Owen, Dunstable (GB);
Keith Thomas Moore, Bradfield (GB);
Adam Charles Mitchell, Colchester (GB)

(73) Assignee: Pickering Interfaces Limited, Clacton-on-Sea, Essex (GB)

( * ) Notice: Subject to any disclaimer, the term of this patent is extended or adjusted under 35 U.S.C. 154(b) by 770 days.

(21) Appl. No.: 11/722,046

(22) PCT Filed: Dec. 16, 2005

(86) PCT No.: PCT/GB2005/050252
§ 371 (c)(1),
(2), (4) Date: Jun. 18, 2007

(87) PCT Pub. No.: WO2006/064292
PCT Pub. Date: Jun. 22, 2006

(65) Prior Publication Data
US 2009/0231774 A1    Sep. 17, 2009

(30) Foreign Application Priority Data
Dec. 18, 2004 (GB) .................................. 0427886.7

(51) Int. Cl.
*H01H 1/66* (2006.01)
(52) U.S. Cl. ........................................ 361/152; 335/151

(58) Field of Classification Search .................. 361/152;
335/151, 207
See application file for complete search history.

(56) References Cited

U.S. PATENT DOCUMENTS

| 3,293,502 | A | * | 12/1966 | Beierle | 361/805 |
| 3,365,701 | A | * | 1/1968 | Jones, Jr. | 335/152 |
| 3,500,267 | A | * | 3/1970 | Wasserman | 335/112 |
| 3,521,381 | A | * | 7/1970 | Sims, Jr. | 434/312 |
| 3,900,807 | A |   | 8/1975 | Hamada et al. | |
| 4,019,164 | A | * | 4/1977 | Deeg | 335/112 |

FOREIGN PATENT DOCUMENTS

FR    1527925    6/1968
WO    WO 2004/021384    3/2004

* cited by examiner

*Primary Examiner* — Danny Nguyen
(74) *Attorney, Agent, or Firm* — Andrus, Sceales, Starke & Sawall, LLP

(57) ABSTRACT

An array of reed switches (13) is assembled on a circuit board (11) having a plurality of through-apertures (12) with one reed switch (13) disposed in each aperture with the axis of the switch envelope (14) extending perpendicularly to the plane of the board. A plurality of coils (16) is provided on the board so that each switch (13) is surrounded by a respective coil, the coils being connected to conductors on the board for operation of the switches. Also disposed is a control circuit wherein the reed switch drive coils (26) are connected in series across a constant-current voltage source and a respective solid-state switch TR1, TR2 . . . connected across each coil, with divers for each solid-state switch to permit operation of a selected reed switch.

31 Claims, 5 Drawing Sheets

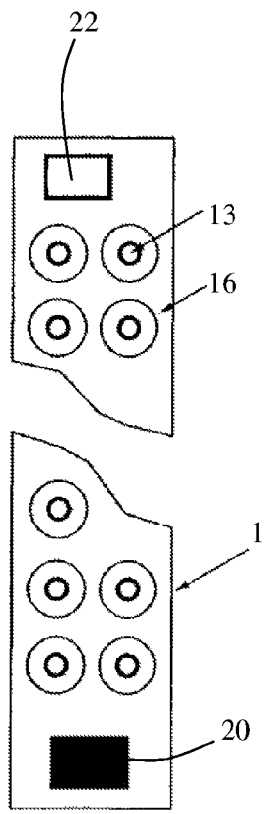
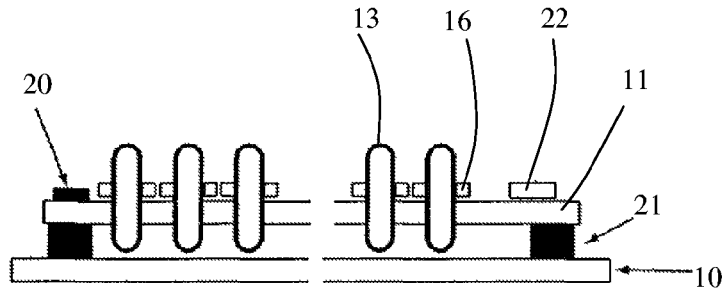
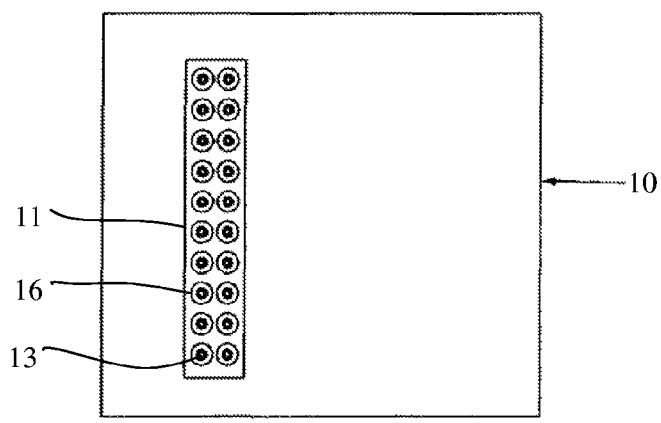
FIGURE 3A  FIGURE 3B  FIGURE 3C
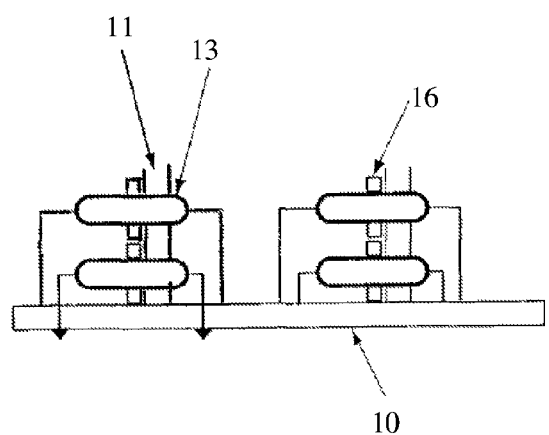
FIGURE 4

REED SWITCH ARRAYS

CROSS REFERENCE TO RELATED APPLICATION

The present application is the U.S. national stage application of International Application PCT/GB2005/050252, filed Dec. 16, 2005, which international application was published on Jun. 22, 2006 as International Publication WO 2006/064292. The International Application claims priority of British Patent Application 04 27886.7, filed Dec. 18, 2004.

This invention relates to reed switches, and in particular to an array of reed switches and methods of assembling such an array. The invention further relates to a control circuit for controlling the operation of an array of reed switches and yet further to a method of controlling such an array.

A typical reed switch has two blades of a ferromagnetic structure mounted in a tubular glass envelope, which supports the blades mechanically and provides a hermetic seal for the contacts. The free ends of the blades provide contacts which can come into engagement with each other to make the switch, the reed blades being plated in the contact area to ensure they have good switching characteristics. Most reed switches are manufactured so that the contacts are normally open but when a magnetic field is applied, the blades are drawn together to make contact. The magnetic field can be provided by a permanent magnet which moves relative to the switch to make or break the contact, or the switch may be operated by a wire coil provided around the outside of the glass envelope. Current passing through the coil generates an axial magnetic field which draws the blades together to make contact, so long as the magnetic field strength is high enough to overcome the resistance of the blades to bending. A typical reed switch might require 20 Ampere-turns (AT) for consistent operation, depending upon the switch ratings, reed size and other factors.

A relay comprising a packaged reed switch together with its operating coil is a robust component which is easy to handle and use. Such a package may have pins suitable for soldering directly to a printed circuit board, using through-hole soldering or surface mounting techniques. Such packaged relays are suitable for use by automatic placement machines.

Though packaged relays have the advantages mentioned above, there are certain disadvantages associated with them. When the coil is energised, the reed blades contact each other and carry current. There is consequently significant self-heating, both from the coil and the current flowing in the blades. The packaging increases the temperature within the envelope as compared to ratings which can be achieved for the reed switch and its coil in free air. If the temperature rises sufficiently, the blades will lose their magnetic properties and the switch will then fail to operate. In view of these issues, the current rating of a packaged reed relay is lower than for just the reed switch on its own.

The coil for generating the magnetic field is made of very fine wire and can be damaged during manufacture of the packaged relay. Coil failures are a common source of device failure in the early part of the service life. Constant heating and cooling of the coil in the package can cause breakages in the very fine wire of the coil through the generation of stress and fatigue.

A further disadvantage is that a packaged relay occupies a relatively large amount of space on a printed circuit board and this limits the achievable density of relays that can be supported in a given volume. Manufacturers have attempted to make the reed relays smaller so that the packages occupy less volume and the relays have been packaged differently to minimise the printed circuit board area occupied by a relay, such as by mounting the reed switch envelope perpendicularly to the base of the package which is secured to a board. Though these methods allow greater relay densities to be achieved, servicing in the event of a fault becomes more difficult coupled with a significant risk of damage to adjacent components.

It is a principal aim of the present invention to allow the provision of an array of reed switches together with their associated operating coils at higher packing densities than can be achieved using conventional packaged relays, without compromising the possibility of servicing the array and also without reducing the contact rating of the switches.

According to one aspect of this invention, there is provided an array of reed switches comprising:
  a circuit board having a plurality of apertures therethrough;
  a plurality of reed switches each having an elongate tubular envelope, which reed switches are mounted one in each aperture respectively such that the envelope axis of each reed switch is substantially perpendicular to the plane of the circuit board;
  a plurality of coils provided on the circuit board so that each reed switch is surrounded by a respective coil; and
  conductors provided on the circuit board and to which the coils are connected whereby driving current may be supplied to the coils.

It will be appreciated that with the array of reed switches of this invention, the individual switches are not separately packaged and then mounted on a circuit board. Rather, the envelopes of the switches are mounted in apertures in the board such that the axes of the envelopes extend essentially at 90° to the plane of the board, each switch drive coil surrounding the envelope on the board. In this way, it becomes possible to achieve high packing densities which may be significantly greater than those achievable with packaged relays and without the attendant disadvantages of thermal derating or servicing difficulties.

The drive coils for the reed switches may be wound remotely from the circuit board as with a conventional packaged relay, the coils then being secured in the required positions, each to surround a reed switch envelope mounted in an aperture. For example each coil may be directly secured to the circuit board by means of an adhesive, or each coil could be contained within a housing such as of a plastics material, which is then secured to the circuit board. Preferably, the wires from each end of the coil are soldered to appropriate conductors such as etched copper tracks provided on the circuit board. The coils would normally be mounted on the board before the reed switches, but assembly method variations can allow a different order of assembly.

For the above arrangement, each reed switch should be mounted so that its contacts on the blades within the envelope are mounted in a region of greatest magnetic flux to ensure reliable operation. Thus, the contacts may be off-set, to the side of the board on which the coil is mounted.

As an alternative, the circuit board may have multiple layers and at least some of the coils may be defined by aligned spiral tracks formed on the multiple layers of the board, during the manufacture thereof. Such spiral tracks defining each coil should be connected in series by means of via-holes formed in the layers of the circuit board, in order to achieve a sufficiently high AT value for operation of the reed switch. Yet another possibility is to manufacture the circuit board of a ceramic material for example by a sintering process, each coil comprising a metallic filament embedded in the material of the board during the manufacture thereof and connected to conductors provided on the board.

For the above alternative arrangements, each reed switch should be mounted so that the contacts on its blades are more or less aligned with the plane of the board, where the magnetic flux will be greatest.

A particularly preferred array of this invention utilises a daughter board mounted on a printed circuit board serving as a mother board, the apertures carrying the reed switch envelopes being provided in the daughter board and at least some of the reed switches having their connecting leads connected to tracks provided on the mother board. In this way, it becomes possible to separate the switched signals from the driving current supplied to the coils, and also servicing becomes simpler—should there be a fault in one reed switch or its coil, it is relatively easy to remove the daughter board or an individual reed switch and replace it by another.

The daughter board could be disposed substantially at right angles to the plane of the mother board or could be disposed parallel to that plane. Even greater packing densities for the reed switches can be obtained by providing two daughter boards each having a plurality of apertures for reed switch envelopes and also having a like plurality of clearance holes for those envelopes, the two daughter boards being arranged so that a reed switch envelope mounted in an aperture of one board extends into a clearance hole in the other board. In this way, it becomes possible to separate the reed switch envelopes by a distance only slightly greater than the outer radius of a coil, rather than slightly greater than the outer diameter of a coil were only a single daughter board provided.

According to a second embodiment of this invention there is provided a method of mounting a reed switch having an elongate tubular envelope to a circuit board, comprising the steps of:
   providing a circuit board with conductors thereon and with an aperture therein of a size suitable for accommodating the envelope of the reed switch; and then in either order
   providing a reed switch drive coil around the aperture in the circuit board, the coil connecting to the conductors of the circuit board; and
   fitting the envelope of the reed switch into the aperture so that the envelope extends substantially perpendicularly to the plane of the printed circuit board, with the contacts substantially aligned with the coil.

The method of this invention may be implemented such that the circuit board has a plurality of like apertures and a plurality of reed switches are mounted one in each aperture respectively. In this way, the method allows the provision of an array of reed switches in a closely packed disposition, without the disadvantages associated with packaged reed relays. The method may be modified and adapted so as to incorporate the various features of an array of reed switches of this invention as described above.

Conventionally, a reed relay including a reed switch and its associated coil is operated by providing a solid state switch in series with the coil, across a voltage source such as a 5 v power supply. The reed switch is actuated by turning on the solid state switch with a suitable control signal so that current flows through the coil to create a magnetic field which draws together the contacts of the reed switch and so turns that switch on. It would be possible to control an array of reed switches of this invention as described above in much the same way, though when high packing densities are used, it will be difficult to provide on a printed circuit board sufficient conductors of adequate current-carrying capacity for driving all of the coils.

As a consequence, and according to yet another aspect of this invention, there is provided a control circuit for a plurality of reed switches each having a drive coil for operating the contacts of the respective reed switch, in which control circuit the drive coils of the reed switches are connected in series, the series-connected drive coils are connected across a constant-current voltage source, a respective solid-state switch is connected across each coil, and there is provided a driver for each solid state switch whereby the reed switches may selectively be operated by controlling the drivers.

With the control circuit of this invention, a plurality of coils may simply be wired in series, along with a solid state switch arranged across the coil. A single conductor may then be provided for each solid state switch, to allow that switch to be turned on. When turned on, the associated coil is in effect shorted out so that no (or little) current will flow through the coil, so allowing the reed switch to open. Conversely, when the solid state switch is turned off, current will flow through the associated coil, creating a magnetic field which will cause the switch to close.

Most preferably, each solid state switch comprises a bipolar device or a FET having a relatively low on-resistance, and typically not more than 25% of the resistance of the drive coil, in order to ensure sufficiently low current flows through the coil when the solid state switch is turned on, to ensure the reed switch opens. In the event that the drive coil has a relatively low resistance compared to the on-resistance of the solid state switch, reliable opening of the reed switch may not be achieved when the solid state switch is turned on. To solve this, it is possible to connect a further solid-state switch in series with each drive coil, the first-mentioned solid-state switch being connected across the drive coil and its associated further solid-state switch. By operating the two solid state switches associated with each drive coil in anti-phase, more reliable and certain operation can be achieved.

Conveniently, the drivers for the solid state switches are provided within an integrated circuit having a serial bus input whereby data supplied to the integrated circuit input controls which reed switches are operated.

Preferably, the series-connected drive coils are connected in series with a constant current sink across a voltage source. The power supply should have sufficient capacity for the number of coils which are expected to be turned on at any one time.

According to another aspect of this invention there is provided a method of controlling the operation of a plurality of reed switches each having a drive coil associated therewith, comprising connecting the drive coils of the reed switches in series across a constant-current voltage source, connecting a respective solid-state switch across each drive coil, and providing a driver for each solid state switch whereby a selected one or more of the reed switches may be operated by controlling the drivers.

By way of example only, certain specific embodiments of this invention and of methods in accordance with this invention will now be described in detail, reference being made to the accompanying drawings in which:—

FIG. 3A is a plan view of a daughter board carrying a plurality of reed switches in accordance with the first embodiment of the invention;

FIGS. 3B and 3C are respectively side and plan views of the daughter board of FIG. 3A mounted on a mother board;

FIG. 4 shows an alternative mother board and daughter board configuration;

Figure 1:
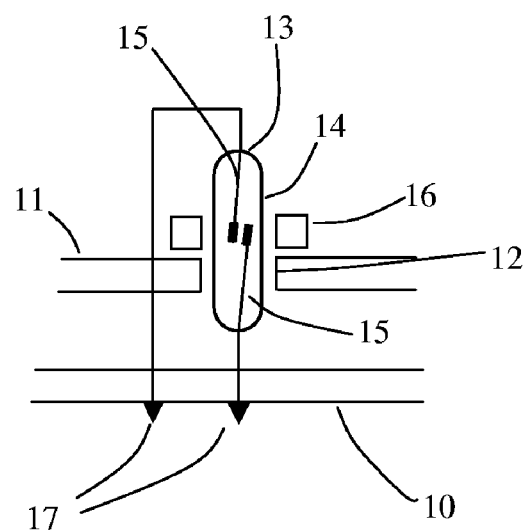
FIG. 1 shows the mounting of a reed switch as a first embodiment of this invention.

Referring initially to FIG. 1, there is shown the implementation of a reed switch mounting arrangement permitting the construction of an array of reed switches according to the invention. A printed circuit board (PCB) mother board 10 supports a daughter board 11 to extend parallel to the mother board. The daughter board, which may also be a PCB or may take some other form as will be described below, is supported on pillars or a connector in a manner known in the PCB art. The daughter board 11 has an aperture 12 formed therethrough, which aperture takes the form of a round hole within which is mounted a reed switch 13 comprising a tubular glass envelope 14 supporting a pair of ferromagnetic spring blades 15. The free ends of the blades are formed as contacts which move together in order to make the switch, when the reed switch is subjected to an external magnetic field. The envelope 14 is shown diagrammatically and provides a support for the blades and also hermetically seals the switch contacts from the ambient.

A wire wound coil 16 is bonded directly to the daughter board in order to surround the envelope 14. The ends (not shown) of the coil are connected by soldering to tracks (also not shown) provided on the daughter board. The connecting leads 17 for the reed switch 13 are wired to the mother board, the lead from the lower end of the envelope 14 connecting directly to the mother board and the lead from the upper end of the envelope being turned through 90° twice and then being fed through a hole formed in the daughter board, also to connect to the mother board.

As shown in FIG. 1, the reed switch envelope 14 is offset with respect to the daughter board, such that the contacts of the blades 15 lie in the region of the wound coil 16 and so in the area of greatest magnetic field.

In order to achieve a sufficiently high AT value, the coil is wound from wire, usually coated in an insulating enamel and a self-bonding coating that permits the coil to be made without a former. The coating makes the wire turns stick together and so prevents the coil from being unraveled easily in the course of handling. The wire of the coil typically may be about 0.1 mm to 0.15 mm diameter, which permits easy handling and termination but which is greater than that usually employed for a packaged relay.

As an alternative to terminating the coil wires directly to the daughter board 11 the coil can be wound directly on a very thin former that includes means for terminating the coil wires. Such a coil could be wound on a machine and terminated to termination contacts on the former, typically by a welding process. The former and its coil can then be directly assembled on the PCB and the former termination contacts soldered directly to the daughter board 11 as part of the normal manufacturing process. This assembly method makes it easier to assemble the daughter board, but takes up additional room on the daughter board and increases the complexity of the coil winding process.

With closely packed reed switches and coils as disclosed, there can be some magnetic interaction between adjacent coils and switches. The degree of interaction depends on a variety of factors, including coil spacing and the reed switch magnetic materials. Experiments show that, even in the most densely packed arrays, interaction can be reduced to an acceptable level by alternating the sense of winding of the coils provided on the daughter board. The coils immediately adjacent to a coil wound in a clockwise direction may be wound in an anti-clockwise direction. Thus a daughter board may have the coils in each row wound in alternate senses, for cases where magnetic interaction is an issue.

In FIG. 1, the relative dimensions of the hole in the daughter board, through the centre of the wound coil and of the envelope are shown diagrammatically. In practice, the envelope will be a close fit within the hole and the coil a close fit to the envelope. As an alternative to using a round hole in the daughter board for mounting the reed switch envelope 14, slots may be formed in the daughter board, from an edge thereof. Though this arrangement may make it easier to fit the reed switches to the board, it will weaken the mechanical structure of the circuit board and make it less easy to secure the wound coil to the board.

Figure 2:
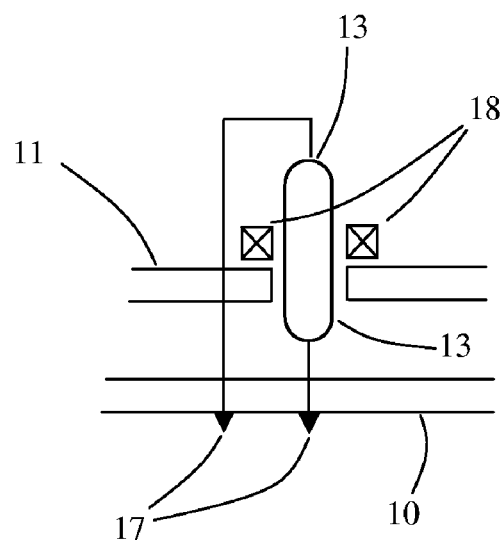
FIG. 2 shows an alternative mounting of a reed switch, as a second embodiment of this invention.

In an alternative embodiment, shown in FIG. 2, the coil 18 is formed as a part of a multi-layer PCB using fabrication methods commonly employed in modern PCB techniques. A spiral coil is fabricated on each layer of the PCB around the hole for receiving the envelope, the coils being connected together by via-holes formed within the layers so that the spirals form one continuous coil that can produce a magnetic field along the axis of the reed switch envelope when a current is passed through the coil. The tracks that make up the coil should have very fine width tracks with the turns on each spiral separated by a small gap. Corresponding tracks may be formed on each side of each layer which are then laminated together to form the complete PCB. In one example of such a coil construction, thirteen layers of coils were used with 5.5 turns per layer. Such a coil had fewer turns and a lower resistance than a wire wound coil; the coil had a resistance of $0.5\Omega$ and required a current of 250 mA to close the reed switch contact with adequate margins to accommodate tolerances in the manufacture of reed switches.

The need to operate the coils at a low voltage and with a high current presents a more complex problem than coils of fine wire which are compatible with typical 5 v power supplies. Coils with more layers and turns allow the use of lower switching currents and permit higher operating voltages. However, increasing the number of turns increases the distance between the switches than can be achieved and therefore lowers the packing density. Using finer wire or tracks, or using more layers in a multi-layered arrangement, makes manufacturing more costly and is likely to lead to degraded reliability.

The open structure shown in FIGS. 1 and 2 allows heat from the coil and any heat generated in the contacts to be relatively easily dissipated away from the reed blades, particularly in a system where there is forced air ventilation. This directly leads to a higher current carrying capability compared to packaged reed relays.

By using a multi-layered coil construction or a coil with a larger diameter wire gauge than used in 5 v compatible coils, the coil inductance and resistance is relatively low compared to packaged designs. This leads to the advantage that when current flow through the coil is commenced to close the reed switch, the rate of increase of current through the coil may be faster than with a wound coil designed for 5V compatibility, so allowing the reed switch to operate more quickly. Conversely, when the coil is de-energised, the current may discharge more quickly through a diode clamp circuit that is conventionally provided to protect the coil drivers from back e.m.f., so improving the switch opening time. Tests have demonstrated release times of about five times faster than is typically found using a packaged reed relay with a high coil resistance and a diode clamp.

FIGS. 3A, 3B and 3C show an implementation of the mounting technique of FIG. 1, used to produce an array of reed switches 13 together with wire wound coils 16 secured to the daughter board 11, at a high packing density. The mother board 10 provides a carrier for the power supplies, control signals and the signal connections. The control signals for the coils may take the form of a simple serial interface which, along with the power connections, can be routed round the edge of the mother board.

Though in FIG. 3C only one daughter board is shown, in practice the mother board may carry a number of such daughter boards, arranged side by side. Each daughter board 11 carries two rows of reed switches 13 which may be disposed side by side as shown, or may be offset by half a pitch, in order to improve the array density. The daughter board lies parallel to the mother board and is supported at one end by a spacer 20 (FIG. 3B) and by a PCB connector 21 at its other end, by means of which power and control signals are supplied to the daughter board.

On each daughter board 11, the reed switch 13 is positioned in a hole in the PCB. As mentioned with reference to FIG. 1, the reed switch leads (not shown) are formed so as to go directly into the mother board 10. The daughter board does not have any tracks which carry the signal to be switched. Though shown with wound coils, the daughter board could incorporate printed coils as previously described and the daughter board carries the power and control connections for these coils, including a FET driver IC 22 for solid-state switches for the current supplied to the coils.

FIG. 4 shows an alternative arrangement, where the daughter boards 11 are disposed perpendicularly with respect to the mother board 10. The leads from each reed switch 13 are simply turned through 90° and are connected to suitable tracks on the mother board. Though in FIG. 4 two reed switches are shown vertically above one another in the daughter board, a single row or more than two rows of such switches may be provided, as required. In other respects, the arrangement of FIG. 4 corresponds to that of FIGS. 3A, 3B and 3C.

With the arrangements of either FIGS. 3A, 3B and 3C or FIG. 4, the wires from a wound coil can be terminated to the daughter board by providing notches in the side of the PCB that have copper attachment pads for the soldering of the wires. The notch will provide a positive mechanical location to hold a wire in position, while being soldered.

The coils may be attached to the daughter board merely by gluing to the surface of the PCB. Alternatively, the coils may be retained by simple plastic housings, connected to the board. If the coil uses thicker wires it may need no additional mechanical retaining method. A further alternative is for the coils to be terminated to contacts on a former, the former contacts then being soldered to the daughter board by conventional soldering techniques.

Though the daughter board has been described as being constructed from PCB material, the same reed switch mounting technique can be used with boards of a ceramic or other material that can carry metal tracks or coils embedded in the ceramic. There are known techniques for constructing three-dimensional embedded coils using sintering processes.

The use of a mother board in conjunction with one or more daughter boards as has been described above has a major manufacturing and design advantage. The same or similar design of daughter boards can be used to implement a large number of switch geometries simply by changing the track wiring on the mother board. This gives an advantage in economies of scale and the adaptation of a mother board to new requirements is relatively simple, resulting in lower costs and a reduced time to market.

Figure 5A:
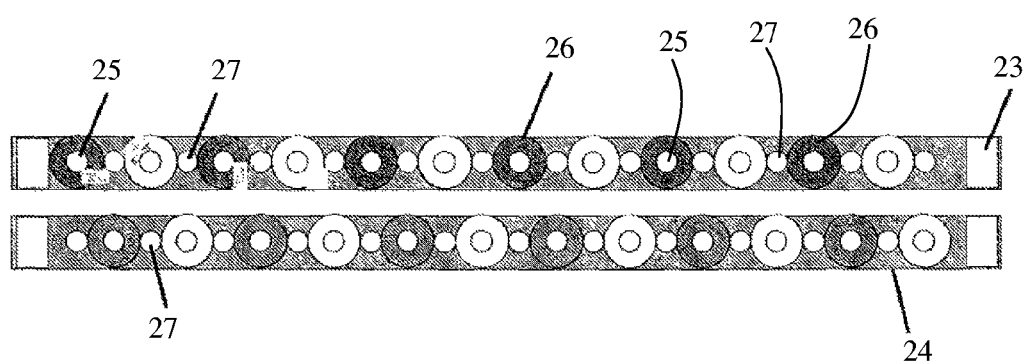
FIGS. 5A and 5B show a pair of daughter boards used together with a mother board, to increase the packing density of an array of reed switches.
Figure 5B:
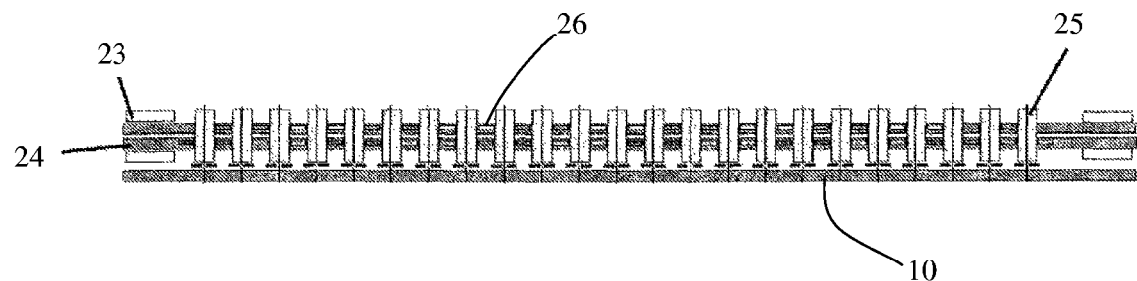

Referring now to FIGS. 5A and 5B, there is shown a daughter board arrangement which allows even greater packing densities, with the coils 26 formed in the board by a multi-layer construction. Two daughter boards 23,24 are provided (shown separately in FIG. 5A but which will in use be aligned vertically) each having a plurality of apertures (not visible in FIG. 5A) for receiving respective reed switches 25 around which are provided coils 26, within the layers of the board. Between each pair of coils there is provided a clearance hole 27 for a reed switch envelope, the pitch of the apertures and holes being the same on both boards. In use, the envelopes of the reed switches 25 of one board are received in the holes 27 of the other board as shown in FIG. 5B, so allowing significantly greater linear packing densities to be achieved. This is because the pitch between the reed switches may be reduced, as the coils of the switches on one daughter board overlap the coils of the switches in the other daughter board.

Figure 6:
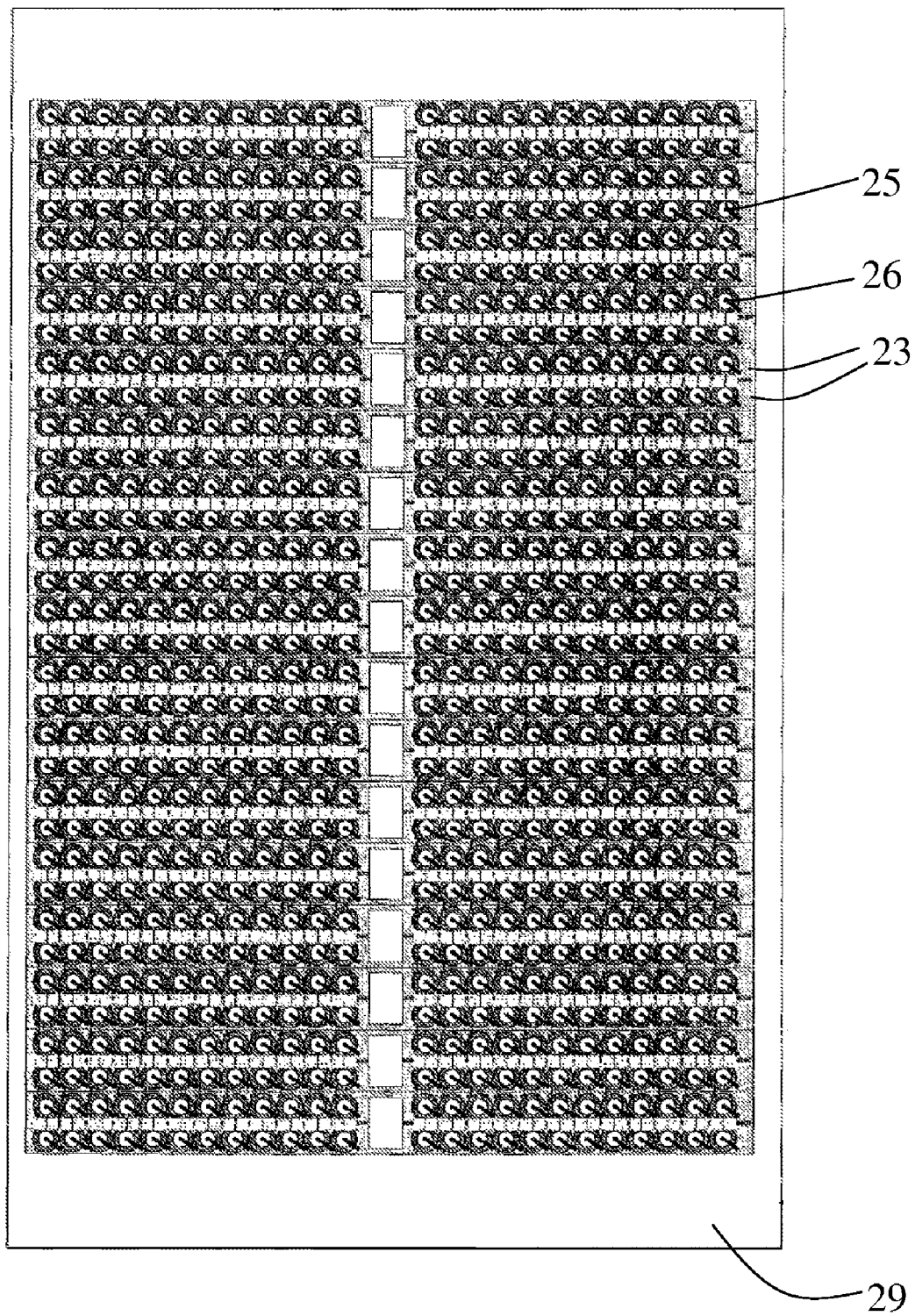
FIG. 6 is a plan view on a mother board having an array of reed switches mounted thereon in accordance with this invention.

FIG. 6 diagrammatically illustrates an assembly of reed switches on a single mother board 29, using dual stacked daughter boards as described with reference to FIGS. 5A and 5B. As can be seen, a very large number of reed switches can be accommodated; in this example, there are thirty-six rows of twenty-four switch daughter boards. This construction can be achieved using a twelve-layer daughter board within which the coils are constructed and a six or eight-layer mother board.

When using coils formed in the layers of a daughter board, the coil resistance will be lower than with a wound wire coil and so also will be the voltage across the coil when a reed switch operating current passes therethrough. Though it would be possible to control the current through each coil by means of an associated series connected semi-conductor switch, the total current demand at a low voltage could be very high if a significant number of reed switches are to be controlled. It would be difficult to implement this on a conventional PCB.

Figure 7:
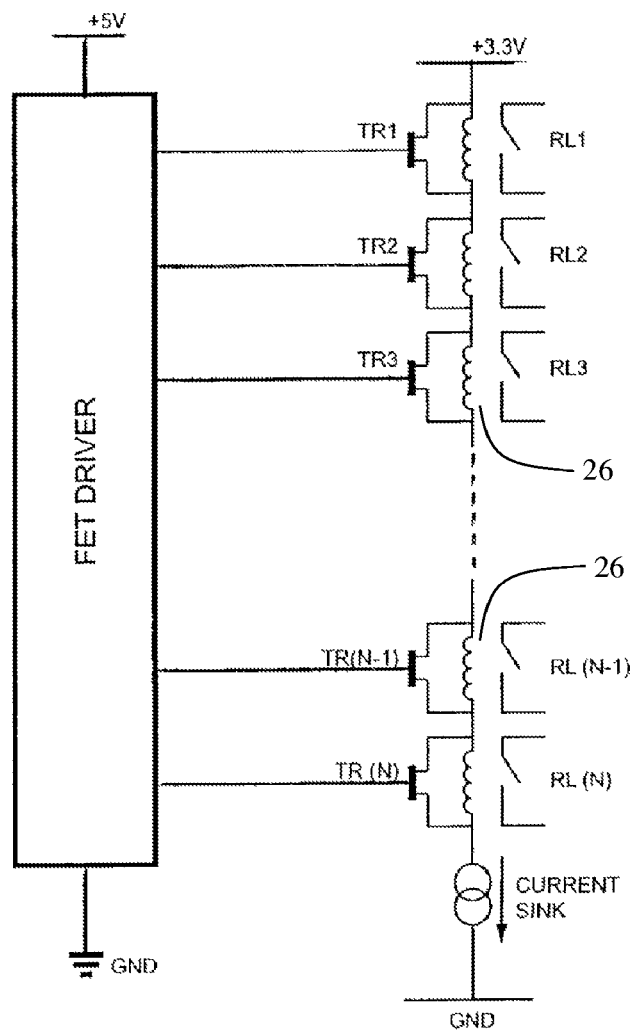
FIG. 7 shows a driving circuit for a plurality of reed switches as may be used in this invention.

Instead of using the usual control technique, the arrangement of FIG. 7 may be employed. Here, the coils of N reed switch relays RL1, RL2 . . . RL(N) are shown connected in series across a 3.3 v line, in series with a constant current sink. Each coil 26 has a respective FET TR1, TR2 . . . TR(N) connected thereacross, though other forms of solid state switch could be employed, such as a bi-polar transistor switch. When any given FET is turned on, the current will bypass the associated coil so that no significant magnetic field is generated by that coil and the associated reed switch opens. To be effective, the on-resistance of the FET must be about a factor of 4 lower than the coil resistance, to ensure enough current is diverted through the FET to open the reed switch.

The number N of coils in a chain should be determined by the maximum expected number of energised coils and the mechanical design of the system. In a typical implementation, a chain of thirty-two coils may be connected in series, controlling thirty-two corresponding reed switches.

Various control arrangements could be provided for the FETs but in FIG. 7, there is shown a FET driver IC having an output for each FET to be controlled and an input (not shown) for a serial bus, for setting the state of each output. Such devices are readily available commercially with eight or sixteen outputs; two such 16 bit devices may provide the control for thirty-two coils, using a simple three-wire serial loop to provide the data.

The constant current sink may also be an IC such as an 8-bit LED driver. If none of the relays in a particular coil chain need to be turned on, the entire chain can be disconnected by turning off the current source, to save power. This feature can be implemented by software drivers that automatically check each chain for the "all off" state, so that the operation is transparent to a user. Using this method, large numbers of reed relays can be operated with relatively few current sources.

Figure 8:
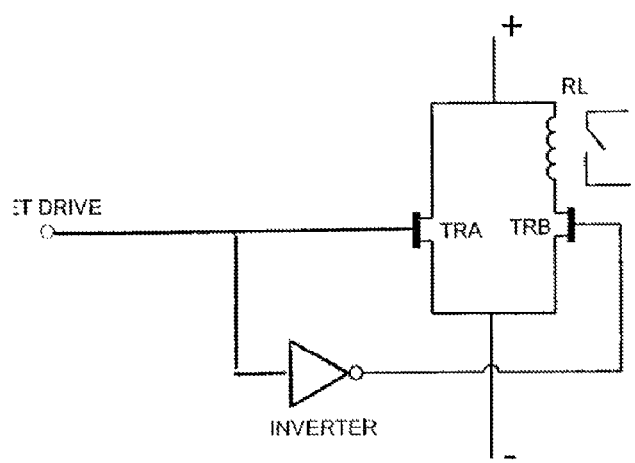
FIG. 8 is a modified form of the driving circuit of FIG. 7.

In the event that the coil resistance is very low, so that opening of a reed switch associated therewith may not be reliable when the control FET is turned on, the circuit of FIG. 8 may be adopted. In this arrangement, two FETs TRA and TRB are used to control the current through each coil, TRA being driven as in the arrangement of FIG. 7 and TRB being driven through an inverter. In this way, whenever one FET is on the other is off; thus, when TRA is turned on, TRB is off and so inhibits current flow through the coil. Conversely, when TRA is off and TRB is on, all of the current flow will be through the coil.

The invention claimed is:

1. An array of reed switches comprising:
    a circuit board having a plurality of conductors provided on the circuit board and having a plurality of apertures formed through the circuit board;
    a plurality of reed switches each having an elongate tubular envelope defining an envelope axis, said reed switches being mounted one in each aperture respectively with the envelope in the aperture such that the envelope axis of each reed switch is substantially perpendicular to the plane of the circuit board;
    a plurality of coils provided on the circuit board so that each reed switch is surrounded by a respective coil; and
    said coils are connected to said conductors on the circuit board for the supply of driving current to the coils.

2. An array as claimed in claim 1, wherein at least some of the coils are wound remotely of the circuit board and are then secured in required positions to the circuit board so that each coil surrounds a reed switch envelope mounted in an aperture.

3. An array as claimed in claim 2, wherein each coil is directly secured to the circuit board by means of an adhesive.

4. An array as claimed in claim 2, wherein each coil is contained within a housing, said housing being secured to the circuit board.

5. An array as claimed in claim 2, wherein each coil has a pair of connecting leads connected to the conductors on the circuit board.

6. An array as claimed in claim 1, wherein each coil is wound on a former and the coil is terminated to contacts provided on the former, said contacts being connected to the conductors provided on the circuit board when the former is mounted thereon.

7. An array as claimed in claim 2, wherein at least some of the reed switches have contacts on blades provided within the envelope and the envelope of each reed switch is set in the board so that the contacts are off-set to one side of the board.

8. An array as claimed in claim 1, wherein the circuit board has multiple layers and at least some of the coils are defined by aligned spiral tracks formed on the multiple layers of the board during the manufacture thereof, the spiral tracks defining each coil being interconnected in series.

9. An array as claimed in claim 8, wherein the interconnections between the spiral tracks of each coil are provided by via-holes formed in the circuit board.

10. An array as claimed in claim 1, wherein the circuit board comprises a printed circuit board and the conductors comprise tracks formed on the board.

11. An array as claimed in claim 1, wherein the circuit board is of a ceramic material and the coils comprise metallic tracks embedded in the material during manufacture.

12. An array as claimed in claim 11, wherein the circuit board is manufactured by a sintering process.

13. An array as claimed in claim 8, wherein at least some of the reed switches have contacts on blades provided within the envelope and the envelope of each reed switch is set in the board so that the contacts are aligned with the plane of the board.

14. An array as claimed in claim 1, wherein the coils are disposed in rows and adjacent coils in each row are wound in opposite senses.

15. An array as claimed in claim 1, wherein the circuit board comprises a daughter board, said daughter board being mounted on a printed circuit board in the form of a mother board, and at least some of the reed switches mounted on the daughter board having their connecting leads connected to tracks provided on the mother board.

16. An array as claimed in claim 15, wherein the plane of the daughter board is disposed substantially at right-angles to the plane of the mother board.

17. An array as claimed in claim 15, wherein the plane of the daughter board is disposed parallel to the plane of the mother board.

18. An array as claimed in claim 17, wherein there are two daughter boards disposed in parallel planes, each daughter board having a plurality of apertures in each of which a respective reed switch is mounted and also having a like plurality of clearance holes, the two daughter boards being arranged so that a reed switch envelope mounted in an aperture of one board extends into a clearance hole in the other board.

19. An array as claimed in claim 1, wherein the apertures in the circuit board are round holes within which the envelopes of the reed switches are a close fit.

20. An array as claimed in claim 1, wherein at least some of the apertures in the printed circuit board comprise slots extending into the board from an edge thereof, the reed switch envelopes being a close fit within the width of the slots.

21. A method of mounting a reed switch having an elongate tubular envelope to a circuit board, comprising the steps of:
    providing a circuit board with conductors thereon and with an aperture therein of a size suitable for accommodating the envelope of the reed switch; and then in either order
    providing a reed switch drive coil around the aperture in the circuit board, the coil connecting to the conductors of the circuit board; and
    fitting the envelope of the reed switch into the aperture so that the envelope extends substantially perpendicularly to the plane of the printed circuit board, with the contacts substantially aligned with the coil.

22. A method as claimed in claim 21, wherein the circuit board has a plurality of like apertures and a plurality of reed switches are mounted one in each aperture respectively.

23. A method as claimed in claim 21, wherein the or each coil is formed separately and is secured to the circuit board in alignment with an aperture therein.

24. A method as claimed in claim 21, wherein the or each coil is formed within the circuit board during the manufacture thereof.

25. A control circuit for a plurality of reed switches each having a drive coil for operating the contacts of the respective reed switch, in which the drive coils of the reed switches are connected in series, the series-connected drive coils are connected with a constant-current voltage source, a respective solid-state switch is connected across each coil, and there is provided a driver for each solid state switch whereby the reed switches may selectively be operated by controlling the driver.

26. A control circuit as claimed in claim 25, wherein each solid state switch comprises a bipolar device or a FET having a relatively low on-resistance.

27. A control circuit as claimed in claim 25, wherein the drivers for the solid-state switches are provided in a serial-bus input integrated circuit, whereby serial data supplied to the integrated circuit controls which reed switches are operated.

28. A control circuit as claimed in claim 25, wherein a further solid-state switch is connected in series with each drive coil, the first-mentioned solid-state switch being connected across the drive coil and its associated further solid-state switch, and the solid state switches associated with each drive coil being operated in anti-phase.

29. A control circuit as claimed in claim 25, wherein the series-connected drive coils are connected in series with a constant current sink and a voltage source.

30. A method of controlling the operation of a plurality of reed switches each having a drive coil associated therewith, comprising connecting the drive coils of the reed switches in series with a constant-current voltage source, connecting a respective solid-state switch across each drive coil, and providing a driver for each solid state switch whereby a selected one or more of the reed switches can be operated by controlling the drivers.

31. An array of reed switches comprising:
- a printed circuit mother board having a plurality of conductors provided thereon;
- a pair of daughter boards mounted on the mother board in a parallel disposition, each daughter board having a plurality apertures and clearance holes with an aperture in one daughter board aligned with a clearance hole in the other daughter board;
- a plurality of reed switches each having an elongate tubular envelope defining an envelope axis, each reed switch being mounted in an aperture in one daughter board with the envelope extending into an aligned clearance hole in the other daughter board, such that the envelope axis of each reed switch is substantially perpendicular to the planes of the daughter boards;
at least some of the reed switches have connecting leads connected to said conductors provided on the mother board; and
- a plurality of coils are provided on the daughter boards around the apertures therein so that each reed switch is surrounded by a respective coil, said coils being connected to conductors on the respective daughter board for the supply of driving current to the coils.

* * * * *